(12) United States Patent
Allen et al.

(10) Patent No.: US 7,342,456 B2
(45) Date of Patent: Mar. 11, 2008

(54) DC-BIAS NETWORK FOR A DISTRIBUTED AMPLIFIER

(75) Inventors: Barry Allen, deceased, late of Rancho Palos Verdes, CA (US); by Janice Allen, legal representative, Rancho Palos Verdes, CA (US); David Brunone, Rancho Palos Verdes, CA (US); Alex Chau, Rancho Palos Verdes, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 122 days.

(21) Appl. No.: 11/406,777

(22) Filed: Apr. 19, 2006

(65) Prior Publication Data

US 2007/0247231 A1    Oct. 25, 2007

(51) Int. Cl.
*H03F 3/04* (2006.01)
(52) U.S. Cl. ........................... 330/296; 330/285
(58) Field of Classification Search ............... 330/285, 330/296, 307, 286, 54, 56
See application file for complete search history.

(56) References Cited

U.S. PATENT DOCUMENTS

| | | | |
|---|---|---|---|
| 4,864,250 A | 9/1989 | Bacon | |
| 5,374,899 A | 12/1994 | Griffiths et al. | |
| 5,585,288 A | 12/1996 | Davis et al. | |
| 5,982,236 A * | 11/1999 | Ishikawa et al. | 330/296 |
| 6,236,289 B1 | 5/2001 | Slenker | |
| 6,469,581 B1 | 10/2002 | Kobayashi | |
| 6,472,941 B2 | 10/2002 | Shigematsu | |
| 6,570,451 B2 * | 5/2003 | Asada | 330/296 |
| 6,639,461 B1 | 10/2003 | Tam et al. | |
| 6,714,081 B1 | 3/2004 | Xu | |
| 6,735,421 B1 | 5/2004 | Claxton et al. | |
| 6,801,088 B2 | 10/2004 | Allen et al. | |
| 6,946,927 B2 | 9/2005 | Allen et al. | |
| 7,145,394 B2 * | 12/2006 | Numanami et al. | 330/277 |

* cited by examiner

*Primary Examiner*—Henry Choe
(74) *Attorney, Agent, or Firm*—Tarolli, Sundheim, Covell & Tummino LLP

(57) ABSTRACT

Systems are disclosed for providing a DC-bias network for a RF distributed amplifier. One embodiment may include a DC-bias network comprising a planar substrate having an input port configured to receive a DC input signal and provide a DC bias at an output port, a microstrip line mounted to the planar substrate and interconnecting the input port and the output port, and a plurality of RF resonators coupled to the microstrip line. Each of the plurality of RF resonators are configured to provide a substantially constant impedance for a respective portion of the frequency band of the RF signal.

14 Claims, 4 Drawing Sheets

DC-BIAS NETWORK FOR A DISTRIBUTED AMPLIFIER

This invention was made with Government support. The Government has certain rights in this invention.

TECHNICAL FIELD

This invention relates generally to communications and, more particularly, to a DC-bias network for a distributed amplifier system.

BACKGROUND

As communication technology has advanced, there have become greater demands on communication bandwidth for information transfer. For example, some broadband data transfer can occur at rates in excess of 40 Gigabits-per-second (Gbps). However, such high rates of data transfer can be expensive for dedicated bandwidth (e.g., leased lines) over the existing telecommunications infrastructure. Accordingly, alternative, more cost effective forms of wireless communications are often considered in designing a given communications system.

One example of a communication system capable of high data rate information transfer is a communications system. Laser communications typically require a distributed amplifier to drive an optical data modulator for transmission. Due to the extremely broad bandwidth of laser communications, the distributed amplifier can be chosen to operate over a very broad radio-frequency (RF) bandwidth. A DC-bias network provides a requisite DC-bias signal to the distributed amplifier. However, to maintain the broad RF bandwidth requirement of the distributed amplifier, the given DC-bias network is typically impedance matched with the output of the distributed amplifier. For example, if the DC-bias network is not properly matched with the output of the distributed amplifier, the RF signal output from the distributed amplifier might be reflected back into the distributed amplifier, thus causing signal interference and effectively reducing the operating bandwidth of the distributed amplifier.

A typical approach for matching the impedance of the distributed amplifier output to the DC-bias network is to provide the DC-bias signal through a conical inductor. The conical inductor is typically mounted at an angle (e.g., 45°) relative to the plane of the distributed amplifier (i.e., above the distributed amplifier) to reduce capacitance associated with the inductor relative to the substrate upon which the amplifier is formed. By mounting the conical inductor at an angle above the distributed amplifier, the conical inductor can provide a very broadband impedance matching relative to the output of the distributed amplifier. However, a conical inductor mounted at an angle relative to the plane of the distributed amplifier is a fragile configuration. As broadband communication becomes more prevalent in society, communication systems are more commonly mounted in satellites that are launched into space. The physical stress caused by a spacecraft launch on devices mounted on the satellite is very severe, and as such, delicate communication components are unlikely to withstand the launch.

SUMMARY

One embodiment of the present invention may include a DC-bias network comprising a planar substrate having an input port and an output port. The DC-bias network may also comprise a microstrip line mounted to the planar substrate and interconnecting the input port and the output port. The DC-bias network may also comprise a plurality of RF resonators coupled to the microstrip line. Each of the plurality of RF resonators may be operative to provide a substantially constant impedance for a respective portion of the frequency band of the RF signal.

Another embodiment of the present invention may include a RF communication system. The RF communication system may comprise a RF distributed amplifier operative to amplify a RF signal. The RF signal may have a given frequency band. The RF communication system may also comprise a DC-bias network that provides a DC-bias voltage to the RF distributed amplifier. The DC-bias network may comprise a plurality of RF resonators, with each of the plurality of RF resonators providing a termination impedance that is approximately matched to an output impedance of the distributed amplifier for a respective portion of the given frequency band of the RF signal. The RF communication system may also comprise a data modulator operative to modulate the RF signal to generate a broadband signal. The RF communication system may further comprise a data transmitter operative to transmit the broadband signal.

Another embodiment may include a method for manufacturing a planar DC-bias network operative to provide a matched impedance DC-bias to a RF distributed amplifier. The method may comprise forming a metallization layer over a substrate and forming an etch mask over the metallization layer. The etch mask may define a microstrip line and a plurality of RF resonators arranged to be disposed on the substrate. Each of the plurality of RF resonators could be coupled to the microstrip line and could comprise at least one of a radial stub member and an elongated stub member. The method may also comprise etching the metallization layer to form the plurality of RF resonators.

DETAILED DESCRIPTION

The present invention relates generally to communications and, more particularly, to a DC-bias network for a RF distributed amplifier. The DC-bias network is provided on a planar substrate and includes a plurality of RF resonators coupled to a microstrip line. The DC-bias network can provide a DC-bias signal to an output of a distributed amplifier. Each of the RF resonators can provide a termination impedance across a given portion of the RF frequency band. The termination impedance can be matched to the output of the distributed amplifier to minimize signal reflection, thus allowing the distributed amplifier to operate across the RF frequency band.

Figure 1:
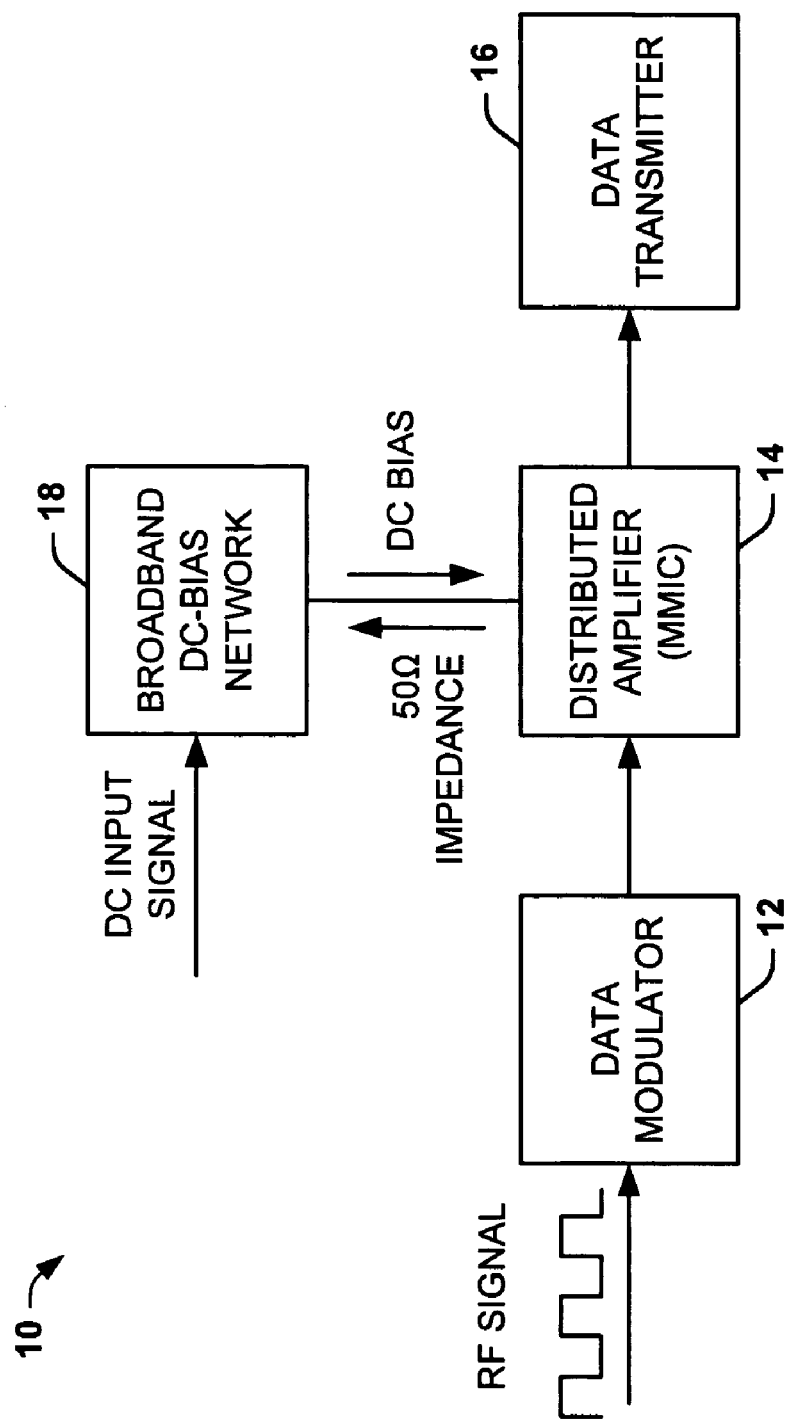
FIG. 1 illustrates an example of a RF communication transmission system in accordance with an aspect of the invention.

FIG. 1 illustrates an example of a communications transmission system 10 in accordance with an aspect of the invention. The communications transmission system 10 includes a data modulator 12, which receives a RF input signal and modulates the RF input signal onto a carrier signal. The data modulator 12 could be, for example, a lithium niobate (LiNbO$_3$) data modulator, such that the RF signal is modulated onto an optical carrier. The modulated signal is output from the data modulator 12 to a distributed amplifier 14. The distributed amplifier 14 could be a monolithic microwave integrated circuit (MMIC), and could include a plurality of field-effect transistors (FETs) with a common drain terminal at the output of the distributed amplifier 14. The distributed amplifier 14 provides an output that is an amplified RF signal. The amplified RF signal could have a very large bandwidth, such as, for example, a substantially DC signal to about 50 GHz. The amplified RF signal is then provided to a data transmitter 16, which transmits the modulated signal at a high data rate (e.g., 40 Gbps). The data transmitter 16 could be, for example, a laser transmitter operative to transmit a modulated optical signal.

The communications transmission system 10 also includes a DC-bias network 18. The DC-bias network 18 could be a planar substrate that includes a plurality of RF resonators (not shown), such that it can be capable of withstanding the severe forces associated with being launched into space. The DC-bias network 18 receives a DC input signal (e.g., 6.5 volts) and provides a DC-bias signal (e.g., 5 volts) to the distributed amplifier 14. The DC-bias signal may be provided to a terminal of the distributed amplifier that is coupled to the common drain of the plurality of FETs in the distributed amplifier 14 in order to permit the plurality of FETs to operate in the linear region. However, as the distributed amplifier 14 outputs the amplified RF signal, the output of the DC-bias network 18 is designed to have an impedance that is approximately matched to the output of the distributed amplifier 14. In the example of FIG. 1, the DC-bias network 18 has an output impedance of approximately 50Ω. Such impedance matching minimizes signal reflection of the amplified RF signal back into the distributed amplifier 14. In addition, because the distributed amplifier is capable of operating at a very large bandwidth (e.g., substantially DC to 50 GHz), the DC-bias network 18 is capable of providing the output impedance matching across substantially the entire bandwidth of the distributed amplifier 14. Accordingly, due to the broadband impedance matching provided by the DC-bias network 18, the output of the distributed amplifier 14 can be substantially free of interference caused by the signal reflection.

It is to be understood that the example of FIG. 1 is but one example of a communications transmission system, and other configurations can be employed to transmit a communications signal. For example, the DC-bias network 18 can be provided for transmitting a laser communications signal, or a variety of other applications requiring a DC-bias with impedance matching over a very broad frequency range.

Figure 2:
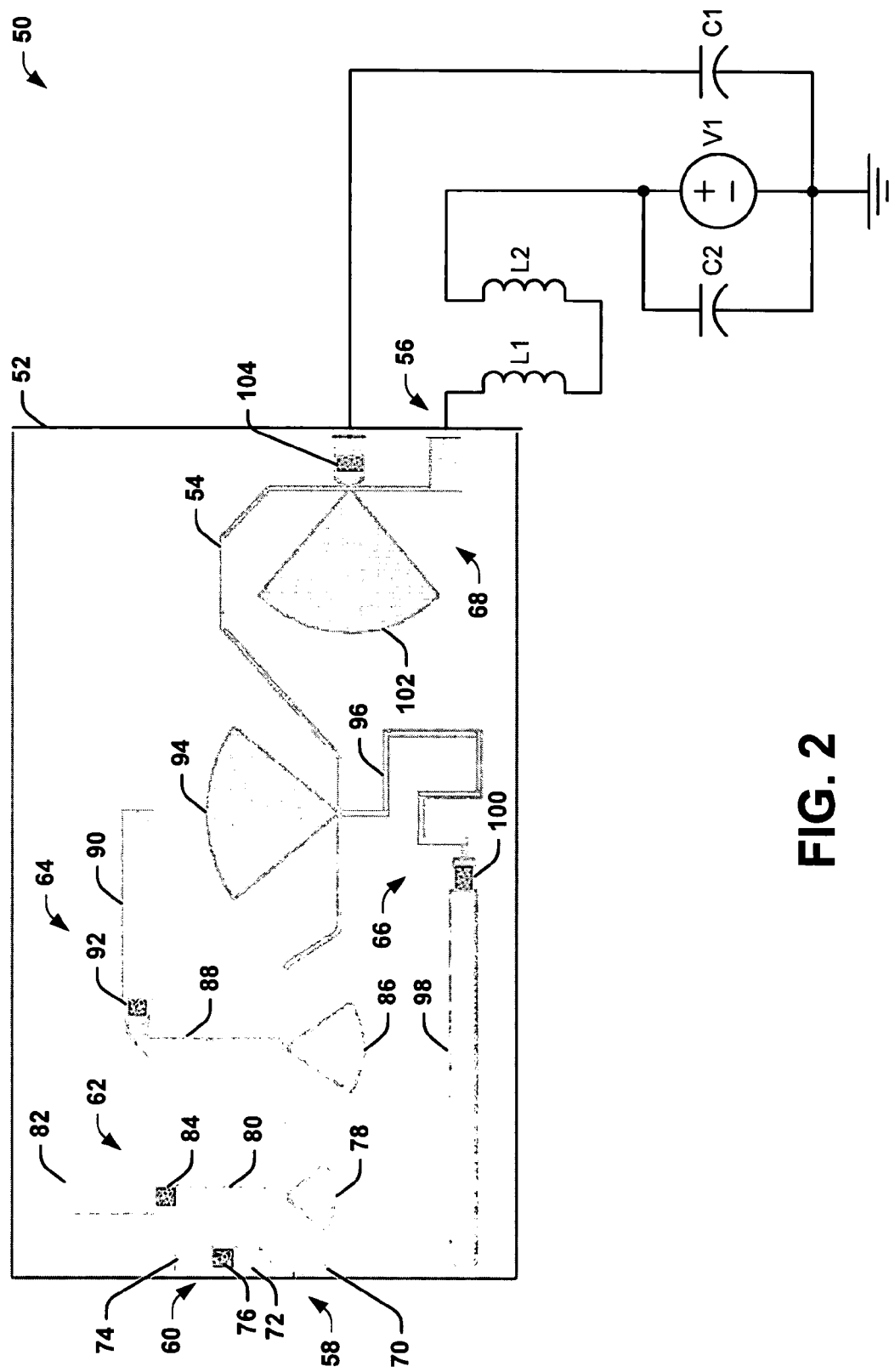
FIG. 2 illustrates an example of a DC-bias network in accordance with an aspect of the invention.

FIG. 2 illustrates an example of a DC-bias network 50 in accordance with an aspect of the invention. The DC-bias network 50 includes a planar DC-bias substrate 52. The planar DC-bias substrate 52 includes a microstrip line 54. The microstrip line 54 is a conductor that carries a DC-bias signal from an input port 56 to an output port 58 of the planar DC-bias substrate 52. The microstrip line 54 could have a width of approximately 0.002". The DC-bias signal can be generated from a DC power supply, labeled V1 in the example of FIG. 2, and can be output to a distributed amplifier. For example, the power supply V1 could generate a DC-bias signal at approximately 6.5 volts that is input to the input port 56 of the planar DC-bias substrate 52, and which is output from the output port 58 at approximately 5 volts due to resistance associated with the planar DC-bias substrate 52. The microstrip line 54 also propagates a RF signal that can be output from a distributed amplifier, such as demonstrated above in the example of FIG. 1, and input to the planar DC-bias substrate 52 at the output port 58.

The planar DC-bias substrate 52 also includes a RF resonator 60, a RF resonator 62, a RF resonator 64, a RF resonator 66, and a RF resonator 68. Each of the RF resonators 60, 62, 64, 66, and 68 are operative to provide an impedance that is substantially matched to the output impedance of the distributed amplifier for a respective portion of the frequency range of the RF signal. For example, each of the resonators 60, 62, 64, 66, and 68 can provide approximately 50Ω impedance for sequentially descending portions of the frequency band of the RF signal, and as such, are configured as series-connected low-pass filters, as will be better demonstrated below with reference to FIG. 3. In addition, the planar DC-bias substrate is easy to manufacture, as it requires little more than metallization and etching processes. By providing a substantially matched impedance to the output impedance of the distributed amplifier for the frequency band of the RF signal on one solid device, along with associated circuit components as described below, the DC-bias network 50 provides a more robust design that is capable of withstanding the rigorous requirements of being launched into space.

The resonator 60 includes a first elongated stub member 70, a second elongated stub member 72, a third elongated stub member 74, and a thin-film resistor 76. The arrangement of the first elongated stub member 70, the second elongated stub member 72, the third elongated stub member 74, and the thin-film resistor 76 are such that, in the example of FIG. 2, the resonator 60 is capable of dissipating RF signals in a range of, for example, approximately 30-50 GHz. For example, the first elongated stub member 70 could be approximately 0.013"×0.006", the second elongated stub member 72 could be approximately 0.016"×0.011", the third elongated stub member 74 could be approximately 0.023"×0.013", and the thin-film resistor 76 could have a resistance value of approximately 120Ω. It is to be understood that all dimensions are in length × width. In addition, the third elongated stub member 74 provides an open circuit impedance of a portion of the incoming RF signal. With such an arrangement, the resonator 60 can provide approximately 50Ω of impedance for RF signals in a range of approximately 30-50 GHz.

The resonator 62 includes a radial stub member 78, a first elongated stub member 80, a second elongated stub member 82, and a thin-film resistor 84. The arrangement of the radial stub member 78, the first elongated stub member 80, the second elongated stub member 82, and the thin-film resistor 84 are such that, in the example of FIG. 2, the resonator 62 is capable of dissipating RF signals in a range of, for example, approximately 18-30 GHz. For example, the radial stub member 78 could have a radius of approximately 0.026" and an angle of approximately 75°, the first elongated stub member 80 could be approximately 0.057"×0.009", the second elongated stub member 82 could be approximately 0.056"×0.018", and the thin-film resistor 84 could have a resistance value of approximately 110Ω. It is to be understood that the dimensions for elongated stub members 80 and 82 are in length × width. In addition, the second elongated stub member 82 provides an open circuit impedance of a portion of the incoming RF signal. With such an arrangement, the resonator 62 can provide approximately 50Ω of impedance for RF signals in a range of approximately 18-30 GHz.

The resonator 64 includes a radial stub member 86, a first elongated stub member 88, a second elongated stub member 90, and a thin-film resistor 92. The arrangement of the radial stub member 86, the first elongated stub member 88, the second elongated stub member 90, and the thin-film resistor 92 are such that, in the example of FIG. 2, the resonator 64 is capable of dissipating RF signals in a range of, for example, approximately 10.8-18 GHz. For example, the radial stub member 86 could have a radius of approximately 0.046" and an angle of approximately 65°, the first elongated stub member 88 could be approximately 0.077"×0.010", the second elongated stub member 90 could be approximately 0.105"×0.018", and the thin-film resistor 92 could have a resistance value of approximately 85Ω. It is to be understood that the dimensions for elongated stub members 88 and 90 are in length x width. In the example of FIG. 2, the elongated stub member 90 is situated such that it is transverse to the elongated stub member 88 and the radial stub member 86. Such an arrangement can reduce surface area associated with the planar DC-bias substrate 52, and thus reducing the overall size of the DC-bias network 50. In addition, the second elongated stub member 90 provides an open circuit impedance of a portion of the incoming RF signal. With such an arrangement, the resonator 64 can provide approximately 50Ω of impedance for RF signals in a range of approximately 10.8-18 GHz.

The resonator 66 includes a radial stub member 94, a microstrip line 96, an elongated stub member 98, and a thin-film resistor 100. The arrangement of the radial stub member 94, the microstrip line 96, the elongated stub member 98, and the thin-film resistor 100 are such that, in the example of FIG. 2, the resonator 66 is capable of dissipating RF signals in a range of, for example, approximately 6.5-10.8 GHz. For example, the radial stub member 94 could have a radius of approximately 0.076" and an angle of approximately 75°, the microstrip line 96 could be approximately 0.255"×0.004", the elongated stub member 98 could be approximately 0.208"×0.016", and the thin-film resistor 84 could have a resistance value of approximately 135Ω. It is to be understood that the dimensions for the microstrip line 96 and the elongated stub member 98 are in length x width. In the example of FIG. 2, the elongated stub member 98 is situated such that it is transverse to the radial stub member 94, and the microstrip line 96 is bent in several locations along its length. Such an arrangement can reduce surface area associated with the planar DC-bias substrate 52, and thus reducing the overall size of the DC-bias network 50. In addition, elongated stub member 98 provides an open circuit impedance of a portion of the incoming RF signal. It is to be understood that the microstrip line 96 is not intended to be limited by the example of FIG. 2, but can be bent in other arrangements or can be straight, as dictated by the application. With such an arrangement, the resonator 66 can provide approximately 50Ω of impedance for RF signals in a range of approximately 6.5-10.8 GHz.

The resonator 68 includes a radial stub member 102 and a thin-film resistor 104. The resonator 68 also works in conjunction with inductors L1 and L2, and capacitors C1 and C2. The arrangement of the radial stub member 102, the thin-film resistor 104, the inductors L1 and L2, and the capacitors C1 and C2 are such that, in the example of FIG. 2, the resonator 68 and associated components are capable of dissipating RF signals in a range of, for example, approximately substantially DC to 6.5 GHz. For example, the radial stub member 102 could have a radius of approximately 0.076" and an angle of approximately 85°, the thin-film resistor 104 could have a resistance value of approximately 50Ω. The inductors L1 and L2 and the capacitors C1 and C2 can be sized appropriately to be able to filter signals down to about 0 GHz frequency (i.e., substantially DC). For example, the inductor L1 can be sized to provide the matched impedance for RF signals of approximately 1-6 GHz, and the inductor L2 can be sized to provide the matched impedance for RF signals of approximately ≦1 GHz. With such an arrangement, the resonator 68, as well as the inductors L1 and L2, and the capacitors C1 and C2, can provide approximately 50Ω of impedance for substantially DC signals to RF signals of up to approximately 6.5 GHz.

It is to be understood that the arrangement of the resonators 60, 62, 64, 66, and 68 is but one example implementation of the planar DC-bias substrate 52. For example, by altering the dimensions and resistance values of the stub members and the thin-film resistors, respectively, the resonators can be configured to provide matched impedance for different portions of the frequency band of the RF signal relative to each other. Additionally, different arrangements of each of the resonators is possible, such as, for example, by including more or less radial and/or elongated stub members, and by including one or more additional thin-film resistors, as dictated by the application. For example, radial stub members generally provide a broader band of impedance matching than elongated stub members, and can be implemented in a greater or lesser number than demonstrated in the example of FIG. 2.

It is further to be understood that the arrangement of the resonator 68 and the inductors L1 and L2 and the capacitors C1 and C2 can vary widely to suit the application. For example, the inductor L1 could be a conical inductor. However, because the inductor L1 is providing the matching impedance to the output of the associated distributed amplifier (e.g., approximately 50Ω) at only a portion of the RF signal frequency band (e.g., 1-6 GHz), and not over the entire frequency band of the RF signal, the inductor L1 need not be mounted at an angle to reduce capacitance. Therefore, a conical inductor L1 can be mounted directly to the planar DC-bias substrate 52, or on another substrate surface, with a longitudinal axis that is substantially parallel to the planar DC-bias substrate 52 or another substrate surface, to provide a more robust design that is suitable for launch into space.

Additionally, such an arrangement of mounting a conical inductor L1 can provide better thermal conduction for the inductor to mitigate problems associated with high current heating in the windings of the inductor L1. In addition, the inductor L2 could be, for example, a toroid. However, the combination of the inductor L1 and the inductor L2 need not be implemented as demonstrated in the example of FIG. 2. For example, the inductors L1 and L2 could be replaced by a single printed spiral inductor that is part of the planar DC-bias substrate 52. Alternatively, the inductors L1 and L2 could be replaced by one or more additional resonators occupying the planar DC-bias substrate 52, such that each additional resonator provides the matched impedance to the distributed amplifier at lower portions of the frequency band of the RF signal.

Figure 3:
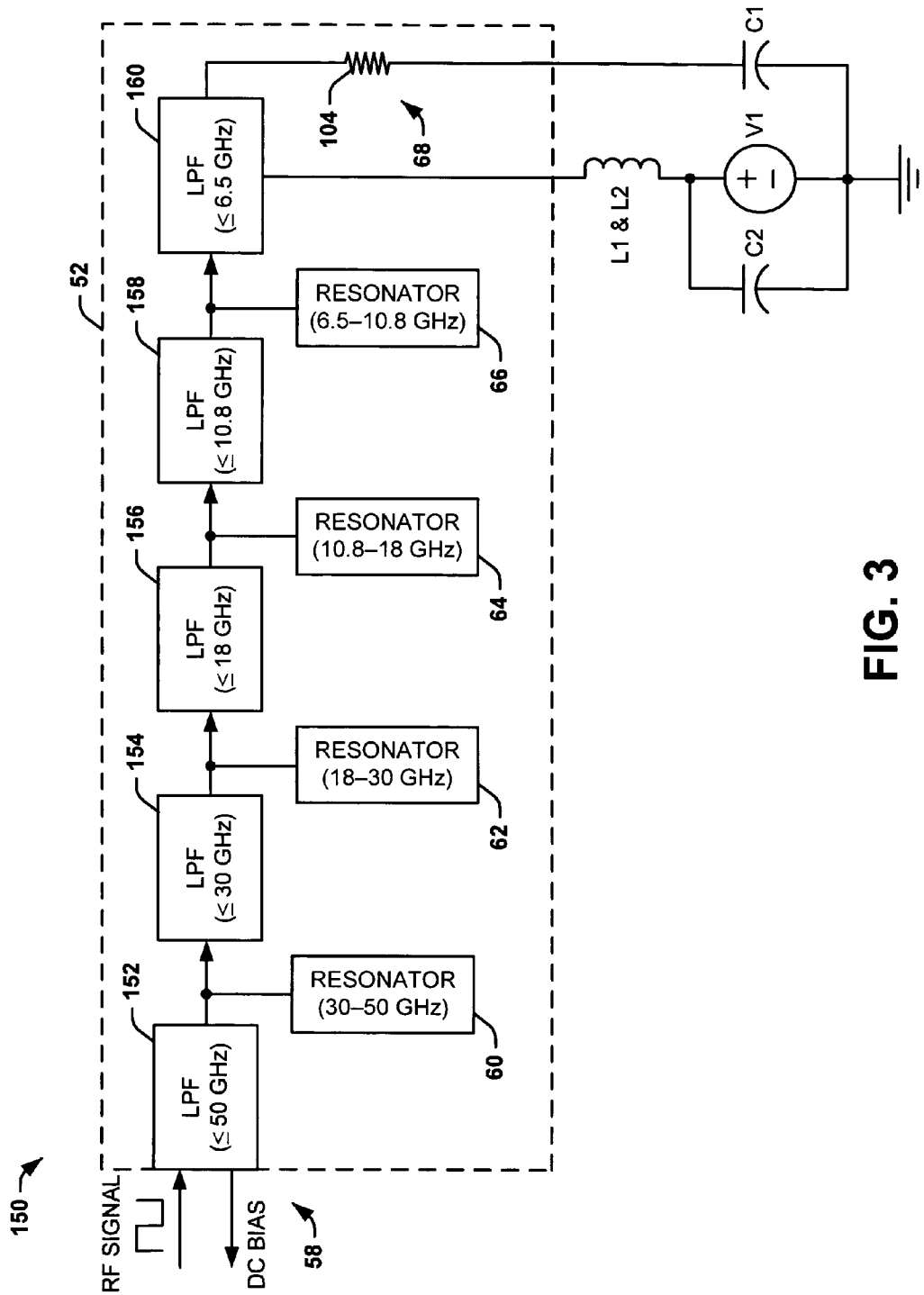
FIG. 3 illustrates an example of a diagram demonstrating RF signal filtration of a DC-bias network in accordance with an aspect of the invention.

The arrangement of the resonators 60, 62, 64, 66, and 68 can be demonstrated diagrammatically with reference to FIG. 3. FIG. 3 illustrates an example of a diagram 150 demonstrating RF signal filtration of a DC-bias network in accordance with an aspect of the invention. In the discussion of FIG. 3 herein, reference will be made to FIG. 2, and as such, like reference numbers will be used. The diagram 150 demonstrates a RF signal being input to the output port 58 of the planar DC-bias substrate 52. The DC-bias signal is also demonstrated as being output from the output port 58.

As described above, the resonators 60, 62, 64, 66, and 68 are configured as series-connected low-pass filters.

In the example of FIG. 3, the output of the planar DC-bias substrate 52 acts as a low-pass filter 152 that passes RF signals of approximately ≦50 GHz. The resonator 60 blocks RF signals having a frequency band of approximately 30-50 GHz. Therefore, the resonator 60 is configured as a low-pass filter 154 that passes RF signals of approximately ≦30 GHz downstream. The resonator 62 blocks RF signals having a frequency band of approximately 18-30 GHz. Therefore, the resonator 62 is configured as a low-pass filter 156 that passes RF signals of approximately ≦18 GHz downstream. The resonator 64 blocks RF signals having a frequency band of approximately 10.8-18 GHz. Therefore, the resonator 64 is configured as a low-pass filter 158 that passes RF signals of approximately ≦10.8 GHz downstream. The resonator 66 blocks RF signals having a frequency band of approximately 6.5-10.8 GHz. Therefore, the resonator 66 is configured as a low-pass filter 160 that passes RF signals of approximately ≦6.5 GHz downstream. The resonator 68 blocks RF signals having a frequency band of approximately substantially DC to 6.5 GHz, and thus behaves as an open circuit impedance to RF signals of ≦6.5 GHz. Therefore, the resonators 60, 62, 64, 66, and 68 are configured as series-connected low-pass filters, such that each of the resonators 60, 62, 64, 66, and 68 sequentially passes a respective lower portion of the frequency band from the output port to the input port. It is to be understood that the resonator 68 is demonstrated as the thin film resistor 104, and that the radial stub 102 is not pictured in the example of FIG. 3. It is to be understood, however, that each of the resonator 68, the inductors L1 and L2, and the capacitors C1 and C2 can operate to pass respective lower portions of the frequency band of the RF signal, and thus can each behave as low-pass filters of descending portions of the frequency band.

Figure 4:
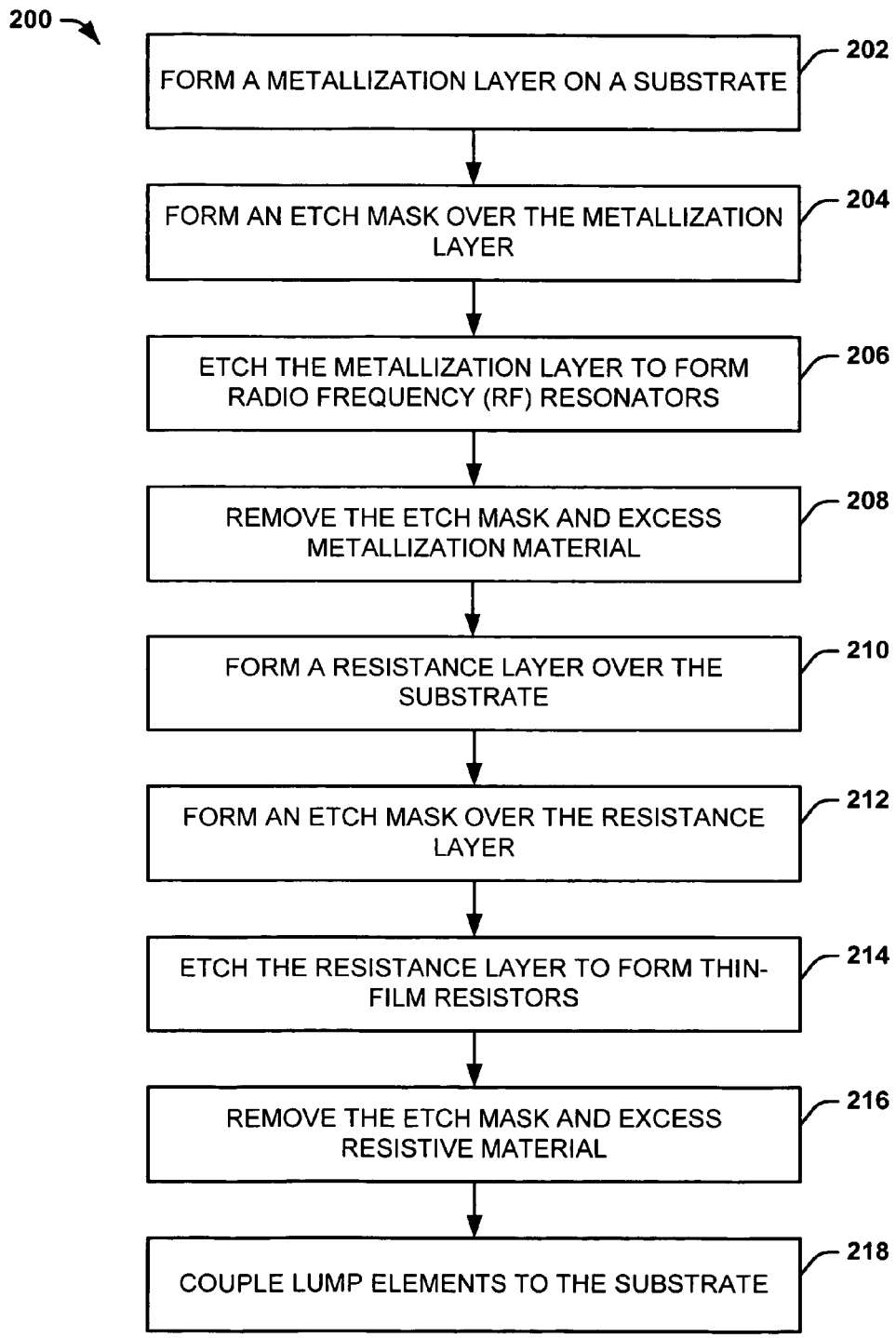
FIG. 4 illustrates an example of a method for manufacturing a planar DC-bias network in accordance with an aspect of the invention.

FIG. 4 demonstrates a method 200 for manufacturing a planar DC-bias substrate in accordance with an aspect of the invention. At 202, a metallization layer is provided on a substrate. At 204, an etch mask is formed over the metallization layer. The etch mask can define a microstrip line, such as the microstrip line 54 in the example of FIG. 2, and a plurality of RF resonators, such as the RF resonators 60, 62, 64, 66, and 68, to be disposed on the substrate. Each of the plurality of RF resonators can be coupled to the microstrip line and can include a combination of radial stub members and elongated stub members. For example, a given RF resonator can include a single radial stub member and two elongated stub members. In addition, the etch mask can define one or more of the RF resonators to have an elongated stub member that is transverse to other associated elongated stub members and radial stub members. In addition, one or more of the RF resonators could also include a microstrip line, such as the microstrip line 96, as dictated by the application. Such an arrangement can reduce surface area associated with the planar DC-bias network, thus resulting in a smaller integrated circuit (IC) or printed circuit board (PCB) package.

At 206, the metallization layer is etched to form the plurality of RF resonators and/or the microstrip line. The etching of the metallization layer can be performed by any of a variety of etching processes known in the art. At 208, the etch mask is removed, along with excess metallization material. At 210, a thin-film resistance material is formed on the substrate. At 212, an etch mask is formed over the thin-film resistance material. The etch mask can define a plurality of thin-film resistors, such that any of the RF resonators formed in the metallization etching process can also include at least one thin-film resistor. At 214, the thin-film resistance material is etched to form the thin-film resistors. The etching of the thin-film resistance layer can be performed by any of a variety of etching processes known in the art. At 216, the etch mask, along with any excess thin-film resistance material, is removed, thus resulting in a substantially finished planar DC-bias substrate. At 218, any of a variety of lump element devices can be coupled to the planar DC-bias substrate to result in a complete DC-bias network. For example, at least one of a conical inductor, a toroid, and one or more capacitors can be coupled to an input port of the planar DC-bias substrate to achieve lower frequency spectrum bandwidth impedance matching.

It is to be understood that additional steps may be included to manufacture a planar DC-bias substrate that are not demonstrated in the example of FIG. 4. Accordingly, the method for manufacturing a planar DC-bias substrate is not intended to be limited by the example of FIG. 4.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A direct current (DC)-bias network for providing a DC-bias to a radio frequency (RF) distributed amplifier, the DC-bias network comprising:
    a planar substrate having an input port configured to receive a DC input signal and provide a DC bias at an output port;
    a microstrip line mounted to the planar substrate and interconnecting the input port and the output port; and
    a plurality of RF resonators coupled to the microstrip line, each of the plurality of RF resonators being configured to provide a substantially constant impedance for a respective portion of the frequency band of the RF signal.

2. The DC-bias network of claim 1, wherein each of the plurality of resonators comprises at least one stub member and at least one thin-film resistor.

3. The DC-bias network of claim 2, wherein the at least one stub member comprises at least one of an elongated stub member and a radial stub member.

4. The DC-bias network of claim 3, wherein at least one of the plurality of RF resonators is arranged such that the at least one elongated stub member is situated transverse to at least one of an additional associated elongated stub member and an associated radial stub member.

5. The DC-bias network of claim 2, wherein the at least one stub member comprises a first stub member and a second stub member, the first stub member being coupled to the microstrip line and the second stub member being an open circuit termination, the first stub member and the second stub member being interconnected by a thin-film resistor.

6. The DC-bias network of claim 1, wherein the impedance provided by each of the RF resonators is about 50Ω and is approximately equal to an impedance of an output of the RF distributed amplifier.

7. The DC-bias network of claim 1, further comprising an inductor coupled to the input port of the planar substrate, the inductor being operative to provide the first impedance for a first portion of the frequency band.

8. The DC-bias network of claim 7, wherein the first portion of the frequency band is less than or equal to about 6 GHz.

9. The DC-bias network of claim 7, wherein the inductor is a conical inductor.

10. The DC-bias network of claim 9, wherein the conical inductor is coupled to a surface of one of the planar substrate and a second substrate, such that the conical inductor comprises an axis that is parallel to the surface.

11. The DC-bias network of claim 7, wherein the inductor is a printed spiral inductor.

12. The DC-bias network of claim 7, further comprising a toroid coupled to the inductor, the toroid being operative to provide the first impedance for a portion of the frequency band that is less than or equal to about 1 GHz.

13. The DC-bias network of claim 1, wherein a first RF resonator of the plurality of RF resonators provides the substantially constant impedance for a first frequency band of the RF signal, the first frequency band being between about 30 and about 50 GHz, a second RF resonator of the plurality of RF resonators provides the substantially constant impedance for a second frequency band of the RF signal, the second frequency band being between about 18 to about 30 GHz, a third RF resonator of the plurality of RF resonators provides the substantially constant impedance for a third frequency band of the RF signal, the third frequency band being between about 10.8 to about 18 GHz, a fourth RF resonator of the plurality of RF resonators provides the substantially constant impedance for a fourth frequency band of the RF signal, the fourth frequency band being between about 6.5 to about 10.8 GHz, and a fifth RF resonator of the plurality of RF resonators provides the substantially constant impedance for a fifth frequency band of the RF signal, the fifth frequency band being between about substantially DC to about 6.5 GHz.

14. The DC-bias network of claim 1, wherein the plurality of RF resonators are configured as series-connected low-pass filters, such that each of the plurality of RF resonators sequentially passes a respective lower portion of the frequency band from the output port to the input port.

* * * * *